United States Patent
Suzuki

(10) Patent No.: US 8,035,755 B2
(45) Date of Patent: Oct. 11, 2011

(54) TV BROADCAST RECEIVER

(75) Inventor: Hirotsugu Suzuki, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 1212 days.

(21) Appl. No.: 11/787,408

(22) Filed: Apr. 16, 2007

(65) Prior Publication Data

US 2007/0242167 A1 Oct. 18, 2007

(30) Foreign Application Priority Data

Apr. 17, 2006 (JP) ................................ 2006-113676

(51) Int. Cl.
H04N 5/50 (2006.01)
H04N 5/44 (2011.01)

(52) U.S. Cl. ........ 348/732; 348/731; 348/725; 348/536; 348/735; 455/180.3

(58) Field of Classification Search .................. 348/732, 348/731, 725, 729, 536, 537, 735; 455/180.3, 455/180.2, 182.2, 164.2, 164.1, 260, 264; 375/327
See application file for complete search history.

(56) References Cited

U.S. PATENT DOCUMENTS

| | | | |
|---|---|---|---|
| 4,360,832 A * | 11/1982 | Rzeszewski | 348/731 |
| 4,373,208 A | 2/1983 | Belisomi | |
| 4,374,437 A | 2/1983 | Citta et al. | |
| 4,385,315 A | 5/1983 | George et al. | |
| 4,422,096 A | 12/1983 | Henderson | |
| 4,776,038 A * | 10/1988 | Testin et al. | 455/182.3 |
| 4,823,387 A * | 4/1989 | Tults | 380/220 |
| 7,080,393 B2 * | 7/2006 | Morisada et al. | 725/38 |

FOREIGN PATENT DOCUMENTS

| | | |
|---|---|---|
| JP | H06-006693 A | 1/1994 |
| JP | 07-264008 | 10/1995 |
| JP | 3052012 U | 6/1998 |
| JP | 2000-068794 A | 3/2000 |
| JP | 3070655 U | 5/2000 |

OTHER PUBLICATIONS

Japanese Notice of the reason for refusal, dated Apr. 30, 2008.
European Examination report dated Oct. 12, 2010.

* cited by examiner

Primary Examiner — Michael Lee
Assistant Examiner — Jean W Desir
(74) Attorney, Agent, or Firm — Yokoi & Co., U.S.A., Inc.; Toshiyuki Yokoi

(57) ABSTRACT

In the course of the channel presetting process, the central frequency is set by a step of 1 MHz within the range from the minimum frequency in the VHF band channel plan to the maximum frequency of the VHF band adopted in the place of destination for the scheduled shipment of the TV broadcast receivers, attempts are made to detect broadcast signals by changing frequency within a range of 1.5 MHz to the high frequency side and 0.5 MHz to the low frequency side from the central frequency, and the frequencies of the detected broadcast signals are stored in the semiconductor memory.

3 Claims, 7 Drawing Sheets

FIG. 3  Prior Art

C.C.I.R. channel frequency assignments

Sound IF 33.4MHz
Picture IF 38.9MHz  (Unit:MHz)

| Ch No. | Center freq | Freq.range | fp | fs | fosc. | Image freq. | Ch No. | Center freq | Freq.range | fp | fs | fosc. | Image freq. |
|---|---|---|---|---|---|---|---|---|---|---|---|---|---|
| 2 | 50.5 | 47~54 | 48.25 | 53.75 | 87.15 | 126.05 | 40 | 626 | 622~630 | 623.25 | 628.75 | 662.15 | 701.05 |
| 3 | 57.5 | 54~61 | 55.25 | 60.75 | 94.15 | 133.05 | 41 | 634 | 630~638 | 631.25 | 636.75 | 670.15 | 709.05 |
| 4 | 64.5 | 61~68 | 62.25 | 67.75 | 101.15 | 140.05 | 42 | 642 | 636~646 | 639.25 | 644.75 | 678.15 | 717.05 |
| 5 | 177.5 | 174~181 | 175.25 | 180.75 | 214.15 | 253.05 | 43 | 650 | 646~654 | 647.25 | 652.75 | 686.15 | 725.05 |
| 6 | 184.5 | 181~188 | 182.25 | 187.75 | 221.15 | 260.05 | 44 | 648 | 654~662 | 655.25 | 660.75 | 694.15 | 733.05 |
| 7 | 191.5 | 188~195 | 189.25 | 194.75 | 288.15 | 267.05 | 45 | 666 | 662~670 | 663.25 | 668.75 | 702.15 | 741.05 |
| 8 | 198.5 | 195~202 | 196.25 | 201.75 | 235.15 | 274.05 | 46 | 674 | 670~678 | 671.25 | 676.75 | 710.15 | 749.05 |
| 9 | 205.5 | 202~209 | 203.25 | 208.75 | 242.15 | 281.05 | 47 | 682 | 678~686 | 679.25 | 684.75 | 718.15 | 757.05 |
| 10 | 212.5 | 209~216 | 210.25 | 215.75 | 249.15 | 288.05 | 48 | 690 | 686~694 | 687.25 | 692.75 | 726.15 | 765.05 |
| 11 | 219.5 | 216~223 | 217.25 | 222.75 | 256.15 | 295.05 | 49 | 698 | 694~702 | 695.25 | 700.75 | 734.15 | 773.05 |
| 12 | 226.5 | 223~230 | 224.25 | 229.75 | 263.15 | 302.05 | 50 | 706 | 702~710 | 703.25 | 708.75 | 742.15 | 781.05 |
| 21 | 474 | 470~478 | 471.25 | 476.75 | 510.15 | 549.05 | 51 | 714 | 710~718 | 711.25 | 716.75 | 750.15 | 789.05 |
| 22 | 482 | 478~486 | 479.25 | 484.75 | 518.15 | 557.05 | 52 | 722 | 718~726 | 719.25 | 724.75 | 758.15 | 797.05 |
| 23 | 490 | 486~494 | 487.25 | 492.75 | 526.15 | 565.05 | 53 | 730 | 726~734 | 727.25 | 732.75 | 766.15 | 805.05 |
| 24 | 498 | 494~502 | 495.25 | 500.75 | 534.15 | 573.05 | 54 | 738 | 734~742 | 735.25 | 740.75 | 774.15 | 813.05 |
| 25 | 506 | 502~510 | 503.25 | 508.75 | 542.15 | 581.05 | 55 | 746 | 742~750 | 743.25 | 748.75 | 782.15 | 821.05 |
| 26 | 514 | 510~518 | 511.25 | 516.75 | 550.15 | 589.05 | 56 | 754 | 750~758 | 751.25 | 756.75 | 790.15 | 829.05 |
| 27 | 522 | 518~526 | 519.25 | 524.75 | 558.15 | 597.05 | 57 | 762 | 758~766 | 759.25 | 764.75 | 798.15 | 837.05 |
| 28 | 530 | 526~534 | 527.25 | 532.75 | 566.15 | 605.05 | 58 | 770 | 766~774 | 767.25 | 772.75 | 806.15 | 845.05 |
| 29 | 538 | 534~542 | 535.25 | 540.75 | 574.15 | 613.05 | 59 | 778 | 774~782 | 775.25 | 780.75 | 814.15 | 853.05 |
| 30 | 546 | 542~550 | 543.25 | 548.75 | 582.15 | 621.05 | 60 | 786 | 782~790 | 783.25 | 788.75 | 822.15 | 861.05 |
| 31 | 554 | 550~558 | 551.25 | 556.75 | 590.15 | 629.05 | 61 | 794 | 790~798 | 791.25 | 796.75 | 830.15 | 869.05 |
| 32 | 562 | 558~566 | 559.25 | 564.75 | 598.15 | 637.05 | 62 | 802 | 798~806 | 799.25 | 804.75 | 838.15 | 877.05 |
| 33 | 570 | 566~574 | 567.25 | 572.75 | 606.15 | 645.05 | 63 | 810 | 806~814 | 807.25 | 812.75 | 846.15 | 885.05 |
| 34 | 578 | 574~582 | 575.25 | 580.75 | 614.15 | 653.05 | 64 | 818 | 814~822 | 815.25 | 820.75 | 854.15 | 893.05 |
| 35 | 586 | 582~590 | 583.25 | 588.75 | 622.15 | 661.05 | 65 | 826 | 822~830 | 823.25 | 828.75 | 862.15 | 901.05 |
| 36 | 594 | 590~598 | 591.25 | 596.75 | 630.15 | 669.05 | 66 | 834 | 830~838 | 831.25 | 836.75 | 870.15 | 909.05 |
| 37 | 602 | 598~606 | 599.25 | 604.75 | 638.15 | 677.05 | 67 | 842 | 838~846 | 839.25 | 844.75 | 878.15 | 917.05 |
| 38 | 610 | 606~614 | 607.25 | 612.75 | 646.15 | 685.05 | 68 | 850 | 846~854 | 847.25 | 852.75 | 886.15 | 925.05 |
| 39 | 618 | 614~622 | 615.25 | 620.75 | 654.15 | 693.05 | 69 | 858 | 854~862 | 855.25 | 860.75 | 894.15 | 933.05 |

FIG. 4  Prior Art

☐ Australia ch.

| Ch. No. | fp | fs | fosc |
|---|---|---|---|
| IF | 36.875 | 31.375 | — |
| 0 | 46.25 | 51.75 | 83.125 |
| 1 | 57.25 | 62.75 | 94.125 |
| 2 | 64.25 | 69.75 | 101.125 |
| 3 | 86.25 | 91.75 | 123.125 |
| 4 | 95.25 | 100.75 | 132.125 |
| 5 | 102.25 | 107.75 | 139.125 |
| 5A | 138.25 | 143.75 | 175.125 |
| 6 | 175.25 | 180.75 | 212.125 |
| 7 | 182.25 | 187.75 | 219.125 |
| 8 | 189.25 | 194.75 | 226.125 |
| 9 | 196.25 | 201.75 | 233.125 |
| 9A | 203.25 | 208.75 | 240.125 |
| 10 | 210.25 | 215.75 | 247.125 |
| 11 | 217.25 | 222.75 | 254.125 |
| 12 | 224.25 | 229.75 | 261.125 |

FIG. 5 Prior Art

☐ Ireland ch.

| Ch. No. | fp | fs | fosc |
|---|---|---|---|
| IF | 39.5 | 33.5 | — |
| A | 45.75 | 51.75 | 85.25 |
| B | 53.75 | 59.75 | 93.25 |
| C | 61.75 | 67.75 | 101.25 |
| D | 175.25 | 181.25 | 214.75 |
| E | 183.25 | 189.25 | 222.75 |
| F | 191.25 | 197.25 | 230.75 |
| G | 199.25 | 205.25 | 238.75 |
| H | 207.25 | 213.25 | 246.75 |
| J | 215.25 | 221.25 | 254.75 |

TV BROADCAST RECEIVER

CROSS-REFERENCES TO RELATED APPLICATIONS

The present application is related to the Japanese Patent Application No. 2006-113676, filed Apr. 17, 2006, the entire disclosure of which is expressly incorporated by reference herein.

BACKGROUND OF THE INVENTION

1. Field of the Invention

The present invention relates to a TV broadcast receiver.

2. Description of the Related Art

In recent years, a majority of tuners used in TV broadcast receivers are frequency synthesizer-type PLL tuners, and generally any frequency inputted from a microcomputer is made to syntonize the locally oscillated frequency at the predetermined frequency to receive the desired channel. For tuning in a station with this PLL tuner, a broadcast signal is searched automatically in advance based on a channel plan for each country (for each region).

If the channel plan is a standard one, the standard step wherein the frequency between the respective channels in the VHF band and the UHF band is almost constant is adopted, and this standard step is a step of 7 MHz in the VHF band and a step of 8 MHz in the UHF band. Therefore, when the place of destination is known and the channel plan is also known, normally the product is preset in the factory before the shipment of the product.

However, there are cases where the number of countries involved is very large such as in Europe and the channel plan adopted is different from the standard channel plan due to the relationship with the neighboring countries. For example, in Europe CCIR (Comite Consultatif International Radiophonique) adopts the standard channel plan. However, in Italy, Ireland, Indonesia and Australia, VHF-Low is different from the standard, and frequency partially shifts by 1-2 MHz.

FIG. 3 shows the standard channel plan (list of frequency assignments) in Europe established by the CCIR (Comite Consultatif International Radiophonique), FIG. 4 shows the channel plan in Australia, and FIG. 5 shows the channel plan in Ireland. In FIG. 3, the lowest channel is the channel 2, and the image intermediate frequency 48.25 Mhz for the channel 2 is the minimum frequency, while in Australia as shown in FIG. 4 the minimum frequency is 46.25 MHz of the channel 0, in Ireland shown in FIG. 5 the minimum frequency is 45.75 MHz. of the channel A. Thus, this list of frequency assignments reveals that each country has adopted channel plans with different central frequencies and frequency steps. Therefore, the products shipped for these regions were required to store all the channel plan data corresponding to these plural destinations in their memory or to set the channel plan for each destination of shipment.

In view of such regional situation, Japanese Unexamined Patent Application Publication (JP-A) No. 1995-264008 disclosed a channel select unit capable of tuning in different channel plans simply by selecting channel even in a region where it is possible to tune in two or more channel plans by presetting a channel for each channel select position and a TV broadcast receiver provided with the same.

The art described above had the following problem. Specifically, in the case of having all the channel plans for each country stored in the memory as in the former case, an increase in cost is still unavoidable, and in the case of shipping the product by presetting different channel plans for each country, work productivity is reduced and therefore an increase in cost is unavoidable as in the latter case. Moreover, the art described in JP-A-1995-264008 is for presetting both of the airwaves in an area where there are a plurality of airwaves, and has a different problem from that of the present application.

BRIEF SUMMARY OF THE INVENTION

The present invention provides a TV broadcast receiver capable of presetting channels by means of an automatic search of broadcast signals in places of destination where different channel plans are adopted.

One aspect of the present invention provides the TV broadcast receiver having a tuner that adopts a frequency synthesizer-type channel select mechanism based on a phase locked loop (PLL) circuitry that displays on the screen the corresponding picture and outputs the corresponding sound on a speaker while receiving TV broadcast signals according to a séquentiel couleur a mémoire (SECAM) or a phase alternation by line (PAL) system according to the present invention, the above-mentioned tuner includes:

a high-frequency amplification circuit for receiving the inputted RF signals on which broadcast signals are superimposed, amplifying the RF signals and outputting the amplified RF signals;

a variable frequency divider for dividing locally oscillated signals inputted and outputting a divided signal;

a reference oscillator for outputting a signal oscillated by a crystal oscillator which are turned into a reference signal after passing through a fixed frequency divider;

a detection circuit for detecting and outputting a positive or a negative voltage corresponding to a phase difference between the divided signal and the reference signal;

an integrating circuit for outputting a DC component out of an inputted detection output;

a voltage controlled oscillator for outputting a local oscillation signals out of an inputted DC component; and a mixing circuit for outputting a differential signal between the locally oscillated signal and a high-frequency amplified RF signals as an intermediate frequency signal out of the inputted RF signals outputted from the high-frequency amplification circuit and the locally oscillated signals. In addition, the tuner also includes:

a microcomputer for making the tuner syntonize a plurality of channel frequencies within a predetermined band by controlling the locally oscillated frequency by changing a frequency dividing ratio by controlling the variable frequency controller; and a semiconductor memory in which information containing a channel number and a central frequency of the preset channels is stored.

When a channel presetting starts, the microcomputer is configured to set the central frequency by a 1 MHz step within the range from a minimum frequency among the channel plan of the VHF band adopted in the scheduled place of destination for shipment of the TV broadcast receiver to a maximum frequency of the VHF band, attempts to detect broadcast signals by changing the channel frequency within a range of 1.5 MHz to a high frequency side and 0.5 MHz to a low frequency side centered around the above-mentioned central frequency by controlling the variable divider, upon detection of any broadcast signals stores the frequency of the detected broadcast signals in a predetermined area of the semiconductor memory, sets the central frequency by a 8 MHz step in a UHF band, attempts to detect any broadcast signals by changing the channel frequency within a range of 1.5 MHz to the high frequency side and 0.5 MHz to the low frequency side centered around the above-mentioned central frequency by controlling the variable divider, and upon detection of any broadcast signals stores the frequency of the detected broadcast signal in the predetermined area of the semiconductor memory.

One aspect of the present invention provides a TV broadcast receiver for displaying the corresponding picture on the screen and outputting the corresponding sound on a speaker while receiving TV broadcast signals includes a phase locked loop (PLL)-type tuner, a broadcast signals search unit for making the PLL-type tuner to search broadcast signals in a step narrower than a standard step, and a channel setting unit for setting channels based on the result of the search of broadcast signals.

The broadcast signals search unit makes the PLL-type tuner to search broadcast signals in a step narrower than the standard step and the channel setting unit sets channels based on the result of the broadcast signals search. The standard step means a 7 MHz step in the VHF band and an 8 MHz step in the UHF band according to the PAL/SECAM system, and an 8 MHz step both in VHF and UHF bands according to the NTSC system. This step also means a channel plan, and in a region where the standard channel plan is adopted, broadcast signals exist in the standard step.

And the broadcast signals search unit searches the presence or absence of broadcast signals within the predetermined range to the high-frequency side and the low-frequency side of the central frequency in each step. And it is desirable that any step narrower than the standard step would be a step narrower than the predetermined range searched by the broadcast signals search unit. For example, if a range of fa MHz to the high-frequency side and fb MHz to the low-frequency side is the predetermined range, it is desirable that the above-mentioned step would be narrower than fa+fb MHz.

By this measure, it is possible to prevent any omission of search for broadcast signals in places of destination where the standard channel plan is not adopted, and it is possible to supply TV broadcast receivers with the same specification to places of destination with different channel plans and to expect a reduction of cost and improvements in work productivity. It is also possible to search irregular broadcast signals not listed on the channel plan, and to set channels in a single broadcast signals search the broadcast signals from a plurality of broadcasting stations in a region where there are such plurality of broadcasting stations based on different channel plans.

An optional aspect of the present invention provides that the broadcast signal search unit is configured to make the tuner search broadcast signals within a range of 0.5 MHz to the low frequency side and a range of 1.5 MHz to the high-frequency side from the central frequency.

Since the predetermined range of 0.5 MHz to the low frequency side and 1.5 MHz to the high-frequency side from the central frequency is a value adopted as the standard value in the ordinary tuners, it is possible to adopt the above-mentioned step by using this value as a reference value. In other words, since it is made clear that the presence of broadcast signals within a range of 2 MHz centered around the central frequency will be searched, it is preferable that the step by which the broadcast signals search unit searches broadcast signals would be narrower than 2 MHz. By this measure, it is possible to adopt a step that can prevent any omission of search in a standard tuner.

An optional aspect of the present invention provides that the broadcast signals search unit makes the PLL-type tuner to search broadcast signals in the above-mentioned step for the VHF band.

In other words, even in a region where a channel plan other than the standard one is adopted, the same channel plan as the standard channel plan is often adopted in the UHF band, it is not always necessary to search broadcast signals with a narrower step than the standard step in the UHF band.

In other words, since the frequency bands in which the standard step is not adopted are mostly in the VHF band, in the frequency band other than the VHF band, in other words in the UHF band, we made it clear that no search will be made in a step narrower than the standard step. By this measure, it will be possible to prevent any omission of searches of broadcast signals by making the step of searching broadcast signals narrower than the standard step only in the VHF band, and to expand the step width to shorten the length of time required for searching broadcast signals and to reduce processing required for searching broadcast signals in the UHF band where the standard channel plan is adopted.

An optional aspect of the present invention provides that the TV broadcast receiver includes a storage medium in which the channel plan data for each place of destination is stored, and the channel setting unit is configured to compare the result of the search for broadcast signals and the channel plan data to identify the place of destination.

In other words, the place of destination where broadcast signals are searched is identified by comparing the result of the broadcast signal search, the combination of frequencies in which the presence of broadcast signals has been detected, and the channel plan for each place of destination.

In other words, in a region where a channel plan other than the standard one is adopted, a characteristic channel plan often tends to be adopted because of the relationship with the neighboring country. In such a case, it is possible to identify which channel plan is being searched by the result of the broadcast signal search even if the whole VHF band is not searched. It is also possible to use the channel plan of the place of destination that has been identified as it is for setting channel. Therefore, the time required for broadcast signals search can be shortened and the processing required for the broadcast signals search can be reduced.

An optional aspect of the present invention provides that the broadcast signals search unit is configured to search broadcast signals based on the channel plan data for each place of destination after the place of destination has been identified.

In other words, when the place of destination is identified, the broadcast signals search unit searches the subsequent broadcast signals based on the channel plan of the place of destination that has been identified. Therefore, searches are conducted less frequently, and no channel is set for the frequency in which no broadcast signals are carried while the same may exist in the channel plan, and therefore this will be more convenient for the users.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character(s) present corresponding parts throughout:

FIG. 3 is the standard channel plan in Europe established by the CCIR.

FIG. 4 is the Australian channel plan.

FIG. 5 is the Irish channel plan.

DETAILED DESCRIPTION OF THE INVENTION

The detailed description set forth below in connection with the appended drawings is intended as a description of presently preferred embodiments of the invention and is not intended to represent the only forms in which the present invention may be constructed and or utilized.

For purposes of illustration, programs and other executable program components are illustrated herein as discrete blocks, although it is recognized that such programs and components may reside at various times in different storage components, and are executed by the data processor(s) of the computers.

Figure 1:
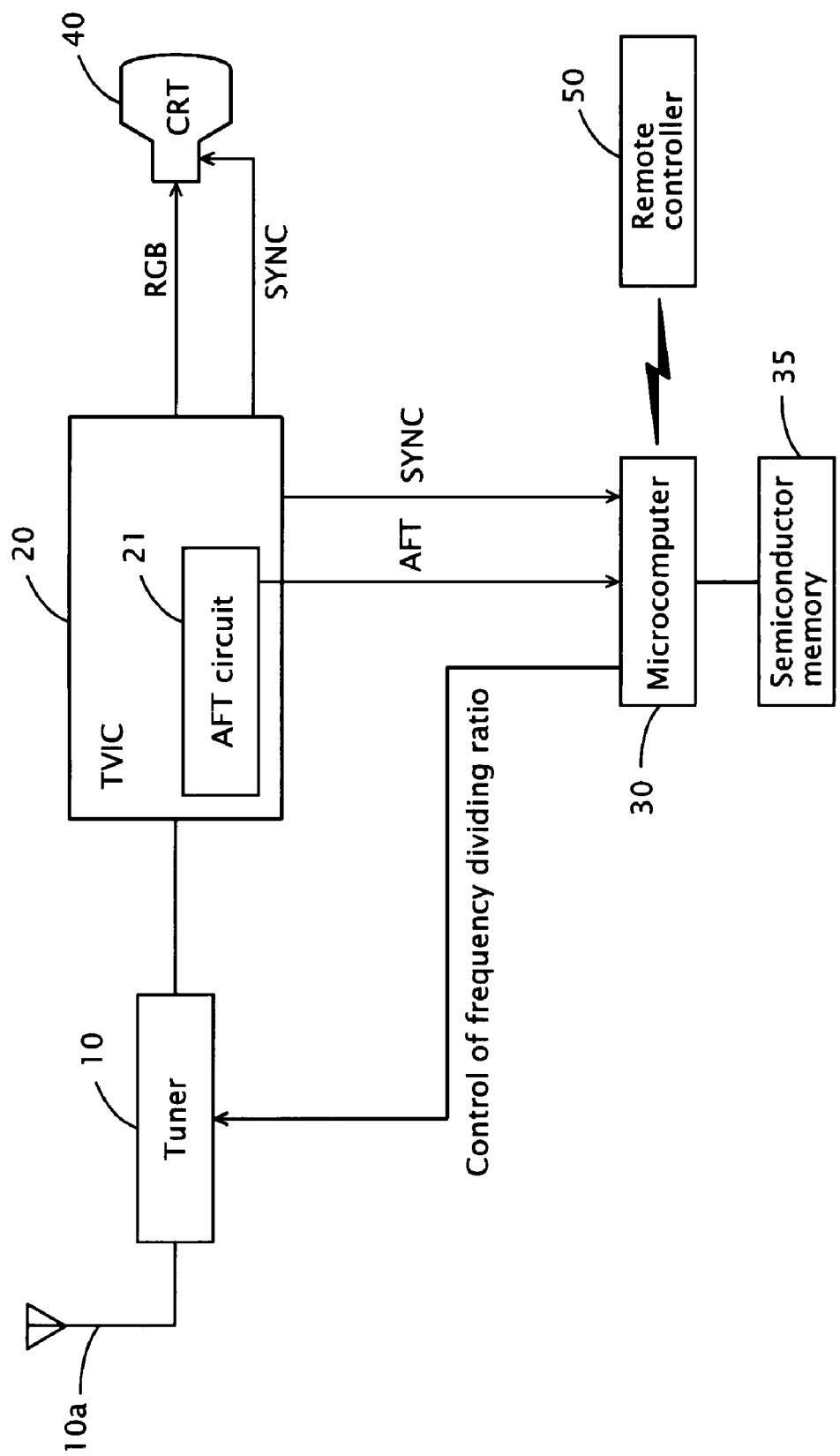
FIG. 1 is a schematic block diagram of the TV broadcast receiver according to the embodiment of the present invention.

We will describe below the embodiment of the present invention according to the following order.
(1) Schematic configuration of the TV broadcast receiver,
(2) Schematic configuration of the tuner circuit,
(3) Processing of the microcomputer for presetting channels
(4) First variation of the processing of the microcomputer for presetting channels
(5) Second variation of the processing of the microcomputer for presetting channels
(6) Conclusion (1) SCHEMATIC CONFIGURATION OF THE TV BROADCAST RECEIVER We will describe below the embodiment of the present invention with reference to the drawings. FIG. 1 is the TV broadcast receiver according to the embodiment of the present invention as shown by a schematic block diagram.

In the schematic block diagram described above, the tuner 10 is a tuner wherein a frequency synthesizer-type channel select mechanism using the so-called PLL circuitry is adopted and is capable of receiving either SECAM system, PAL system or NTSC system or the combined TV broadcast signals. The tuner 10 can be connected with an antenna 10a as the input source of broadcast signals. And the tuner selects only the required signals from the received signals by syntonizing the signals among the airwaves to the channel frequency, amplifies them at high frequency, converts them into intermediate frequency signals (IF) and outputs them. Such intermediate frequency signals are inputted into a TVIC20, and synchronized signals (SYNC) are extracted from the signals demodulated by the processing in the TVIC20, and the synchronized signals are outputted to the microcomputer 30.

The microcomputer 30 can change the frequency dividing ratio by controlling a variable divider within the tuner 10, and control the locally oscillated frequency of the tuner 10. As a result, the tuner 10 can tune in a plurality of channel frequencies within the predetermined band. Based on the synchronized signals, the microcomputer 30 can judge whether the tuner 10 has tuned in appropriate broadcast signals. Therefore, based on the synchronized signals based on the intermediate frequency signals outputted by the tuner 10, the microcomputer 30 can be the to be feedback controlling the syntonization frequency of the tuner 10.

The intermediate frequency signals outputted by the tuner 10 are inputted into the TVIC20. The TVIC20 is performing various signal processing such as the demodulation of image signals and voice signals based on the intermediate frequency signals. With regards to the image signal, the TVIC20 detects image signals after amplifying the inputted the intermediate frequency signals, and executes the predetermined color demodulation processing based on the detection output and outputs RGB signals.

These RGB signals are outputted to the CRT40 through a cathode amplifier (not shown), and the corresponding image signals are displayed on the CRT40 screen. After an amplification of the voice intermediate frequency, the tuner voice detects the voice signals, and separates the main channel voice signals and the subsidiary channel voice signals based on the voice detection outputs and demodulates the same. The demodulated signals pass through a matrix circuit, an amplifier and the like to be outputted to a speaker (not shown), and the corresponding voice signals are outputted.

In addition to the processing of such image signals, voice signals and the like, the TVIC20 also separates horizontal and vertical synchronizing signals. In addition to outputting for executing horizontal and vertical drives in the CRT40, it inputs the horizontal and vertical synchronizing signals (SYNC) into a general-purpose port provided in the microcomputer 30 for verifying the completion of channel selection. The microcomputer 30 judges whether it is in a no picture signal state or not by sampling the intervals of horizontal synchronizing signals inputted by this general-purpose port.

The microcomputer 30 proceeds to a presetting operation of registering the frequencies in which image signals are present as the central frequency by corresponding such frequencies to each channel number by thus judging whether it is in a no image signal state or not. In the present embodiment, for presetting, attempts are made in the respective whole frequency zone of VHF Low band, VHF High band, UHF band.

In other words, the microcomputer 30 at first switches on the voltage controlled oscillator 13 to make the tuner ready to receive VHF Low band. And it changes the syntonized frequency successively by controlling the frequency dividing ratio of the variable frequency divider 17, and as a result the syntonized frequencies in which the presence of image signals is identified by the horizontal synchronizing signals inputted through the general-purpose port of the microcomputer 30 are stored in the semiconductor memory 35. And the voltage controlled oscillator 13 is switched on to store the syntonized frequencies in the VHF High band and the UHF band.

The semiconductor memory 35 stores as required information indicating the channel number of preset channels and the central frequencies in the predetermined area, and in the first variation and the second variation described below the same semiconductor memory 35 stores data representing the channel plan for each place of destination.

The microcomputer 30 executes controlling operation of various other circuits. For example, it accepts the input operations executed by the user through a remote controller 50, and executes processes corresponding to the specifics of the operations. Specifically, when the user carries out an input operation by pushing the button of the remote controller 50, the infrared remote control signal corresponding to the specifics of the operation is outputted, and the contents of the infrared remote controlled signals accepted by a photo acceptance unit (not shown) are analyzed by the microcomputer 30, and in response to the specifics of operation, channels and sound volume are tuned upward or downward and other operations are carried out. Such processing operations of the microcomputer 30 are carried out by the execution of various programs in the program execution environment including memories provided in the microcomputer 30.

(2) SCHEMATIC CONFIGURATION OF THE TUNER CIRCUIT

Figure 2:
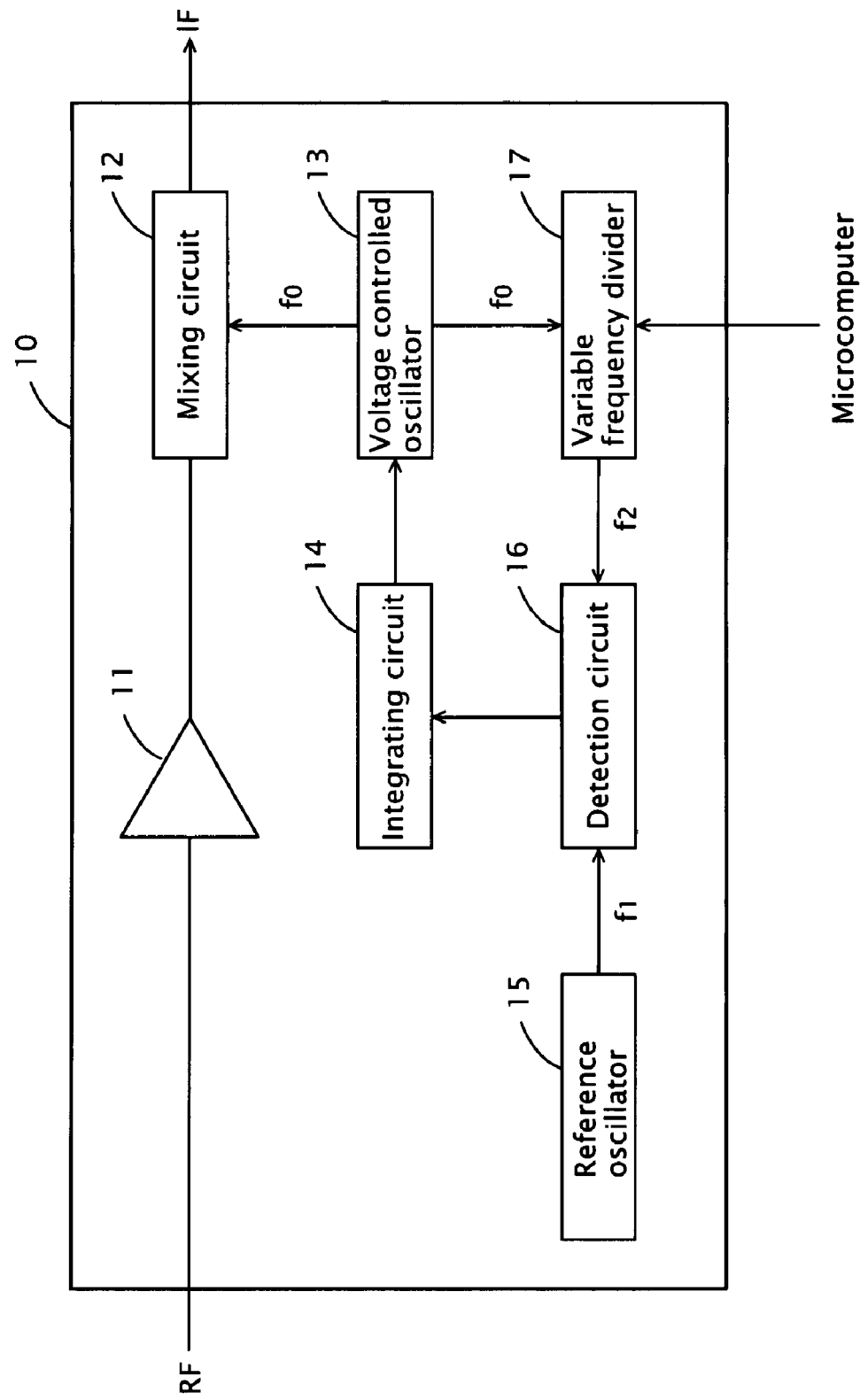
FIG. 2 is a block diagram showing the schematic configuration of the tuner according to the embodiment of the present invention.

FIG. 2 is a block diagram showing the schematic configuration of the tuner 10.

In the figure, RF signals on which broadcast signals are superimposed are inputted into the tuner 10 through the antenna, and the inputted RF signals are amplified by the high-frequency amplification circuit 11 to be inputted into the mixing circuit 12.

The RF signals and the locally oscillated signals f0 outputted by the voltage controlled oscillator 13 are inputted into the mixing circuit 12. And the mixing circuit 12 outputs the differential signals between the locally oscillated signals f0 and the high-frequency amplified RF signals as intermediate frequency signals. The frequency of the locally oscillated signals f0 can be changed by the control of the microcomputer 30, and it is possible to say that their frequency is stabilized by the feedback control of the microcomputer 30.

The voltage controlled oscillator 13 has a resonance circuit (not shown), and the capacity component constituting the resonance circuit by the applied voltage is variable. This applied voltage is supplied by the integrating circuit 14, and the voltage controlled oscillator 13 changes the frequency in response to this voltage and output the resulting signal as the locally oscillated signal f0.

The variable frequency divider 17 is a circuit for dividing the inputted signals and outputting the same, and the frequency dividing ratio can be changed by the control of the microcomputer 30. Therefore, the microcomputer 30 can change the frequency for tuning in by changing the frequency dividing ratio, and can identify the frequency. This variable frequency divider 17 has already accepted the input of locally oscillated signal f0 outputted by the voltage controlled oscillator 13, and the output of this variable frequency divider 17 is inputted into the detection circuit 16 as frequency divider signal f2.

On the other hand, the reference oscillator 15 is a circuit for outputting the oscillated signals of a crystal oscillator and the like through a fixed frequency divider, and its output is inputted into the detection circuit 16 as the reference signal f1. The detection circuit 16 is a circuit for detecting and outputting the positive and negative phase corresponding to the phase difference between the inputted frequency divider signal f2 and the reference signal f1. Then, the DC component is extracted by the input of the detected output into the integrating circuit 14, and the DC component is inputted in to voltage controlled oscillator 13.

As described above, the voltage controlled oscillator 13 oscillates in response to this DC component, and controls so that the phase difference between the frequency divider signal f2 and the reference signal f1 may converge to zero. In other words, it is a circuit configured to control frequency by feedback. And in the voltage controlled oscillator 13, it is possible to make different resonance circuits effective by switching on a plurality of circuits, and to start channel selection operation for broadcast signals in a plurality of frequency bands by the switching on of the microcomputer 30 for each band.

(3) PROCESSING OF THE MICROCOMPUTER FOR PRESETTING CHANNELS

Figure 6:
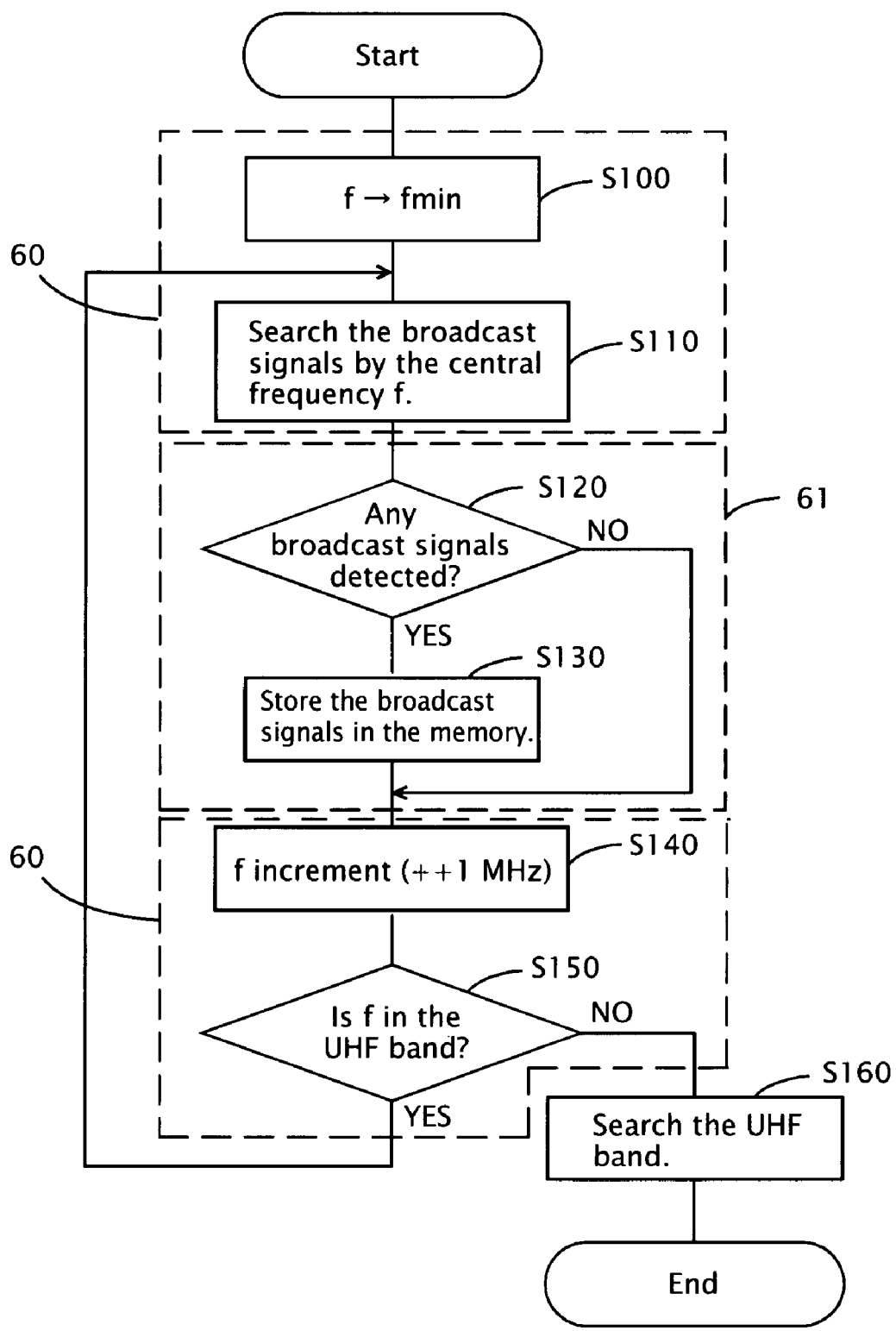
FIG. 6 is a flowchart showing the processing of a microcomputer executing the presetting of channels.

FIG. 6 is a flowchart showing the processing of the microcomputer for presetting channels. When the channel presetting operation is started by pushing on the predetermined buttons of the remote controller 50, to begin with in the step S100, the microcomputer 30 sets the minimum frequency fmin adopted in the VHF Low band as the central frequency f for searching broadcast signals, and makes it possible to receive the VHF Low band by switching on the voltage controlled oscillator 13.

The minimum frequency in the channel plan for the region chosen for the place of destination is adopted as this minimum frequency fmin, and for example if the place of destination is Europe, the frequency of 45.75 MHz for the channel A of Ireland and the like are adopted. And when the central frequency for searching broadcast signals shifts from the VHF Low band to the VHF High band, the microcomputer 30 switches on the voltage controlled oscillator 13 to change the band in which broadcast signals can be received as required.

In the step S110, attempts are made to detect broadcast signals by changing within the predetermined range the frequency for searching broadcast signals by taking the central frequency f as the center by controlling the variable frequency divider 17. This change is generally made within a range of 2 MHz constituted by 1.5 MHz to the high-frequency side and 0.5 MHz to the low-frequency side. And generally in the detection of broadcast signals, the object of attempt of detection is the carrier wave of image signals having strong signal intensity, and after the carrier wave of image signals has been detected, frequency is shifted by the predetermined amount to detect voice signals having weak signal intensity.

In the step S120, the question of whether broadcast signals have been detected or not within the predetermined range from the central frequency in the step S110 is judged. If it is judged that broadcast signals have been detected, it will be considered that the conditions have been met and the process advances to the step 130, where the frequency of the detected broadcast signals will be stored in the predetermined area of the semiconductor memory 35 and the process then proceeds to the step 140. On the other hand, if it is judged that no broadcast signals have been detected, it is considered that the conditions have not been met and the process advances to the step S140.

In the step S140, the central frequency f is reset at a value higher by 1 MHz than what it was before (f increment). Of course, this increment may be 2 MHz instead of 1 MHz, and any value smaller than 7 MHz representing the standard step of the VHF band may be adopted. However, since it is possible to detect broadcast signals within the range of 2 MHz from the central frequency in the search for broadcast signals as described above, it is preferable to limit the increment within the value of 2 MHz.

And in the step 150, the question of whether the value of the central frequency set in the step S140 is within the range of the VHF band or not is judged. When the value of the central frequency set in the step S140 is within the range of the VHF band, it will be considered that the conditions have been met and the process returns to the step S110, and the process starting with the step S110 is repeated. On the other hand, when the value of the central frequency set in the step S140 is not in the VHF band, it will be considered that the conditions have not been met and the process advances to the step S160, where broadcast signals in the UHF band are searched in the standard step (UHF: 8 MHz step) to end the process.

Thus, by having broadcast signals in the VHF band searched not in the standard step but in 1 MHz step in this way, it will be possible to find broadcast signals irrespective of the presence of any channel plan data even in a region where a channel plan different from the standard one in the VHF band is adopted, and channels can be preset. Therefore, it is no longer necessary to store the channel plan data for each place of destination in the memory and the memory capacity can be reduced. At the same time, work efficiency improves because it is no longer necessary to set the channel plan for each place of destination at the time of shipping.

As described above, the microcomputer 30 executing the process between the steps S100-S110 and the steps S140-S150 shown in FIG. 6 constitutes the broadcast signals search unit 60. And the microcomputer 30 carrying out the processing between the steps S120-S130 shown in FIG. 6 constitutes the channel setting unit 61.

(4) THE FIRST VARIATION OF THE PROCESSING OF THE MICROCOMPUTER FOR PRESETTING CHANNELS

In the embodiment described above, it is possible to adopt a configuration for judging to which place of destination having adopted which channel plan the detected frequency belongs by comparing the frequency detected at the stage where the frequency in which the broadcast signals are detected and the channel plan. The adoption of such a configuration can save time required for the search of broadcast signals and is convenient. In this case, it is necessary to store information containing the channel plan for each place of destination in storage mediums such as semiconductor memory 35.

Figure 7:
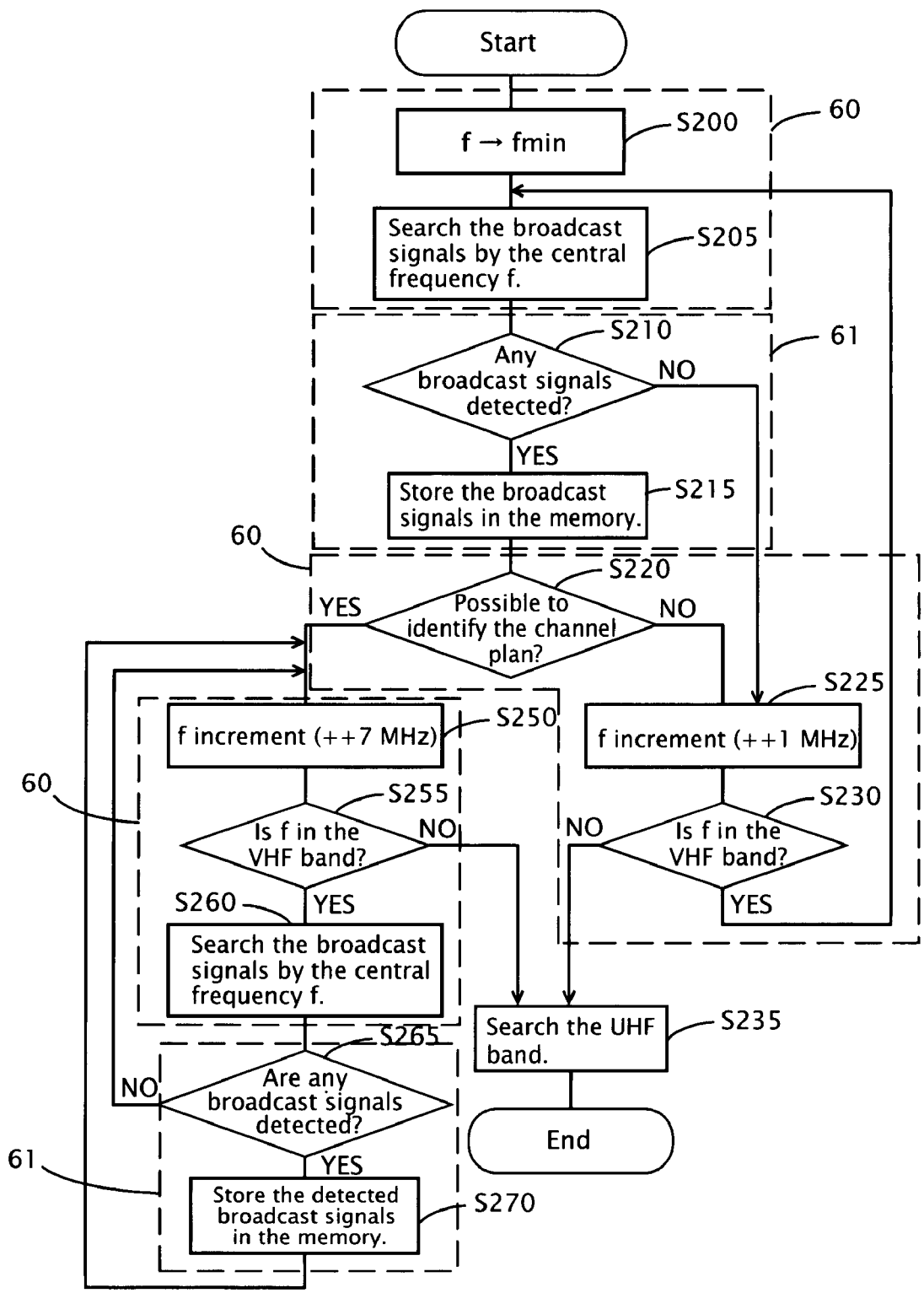
FIG. 7 is a flowchart showing the processing of a microcomputer executing the presetting of channels according to the first variation.

As an example of such a configuration, FIG. 7 shows the flowchart of the processing of the microcomputer presetting channels for identifying the region from the frequency detected. The processing of the step S200 and S205 in the flowchart of the figure is the same as that for S100 and S110 in the flowchart shown in FIG. 6 and therefore we will omit the description of the same.

In the step S210, the question of whether broadcast signals have been detected in the predetermined range from the central frequency or not in the step S205 is judged. If it is judged that the broadcast signals have been detected, it is considered that the conditions have been met and the process advances to the step S215, where the frequency of the detected broadcast signals is stored in the predetermined area of the semiconductor memory 35 and the process advances to the step S220. On the other hand, if it is judged that no broadcast signals have been detected, it is considered that the conditions have not been met and the process advances to the step S225.

When the step S215 is completed and the process advances to the step S220, the frequency of the broadcast signals stored in the predetermined area of the semiconductor memory 35 in the step S215 and the information containing the channel plan of each place of destination stored in the semiconductor memory 35 are compared. And if it possible to judge whether the frequency is the one that belongs to the place of destination where any channel plan is adopted, it is considered that the conditions have been met and the process advances to the step S250. On the other hand, if it is impossible to judge to which place of destination where any channel plan has been adopted the frequency belongs, it is considered that the conditions have not been met, and the process advances to the step S225.

If it is considered that the conditions have been met in the step S210 or the step S220, and the process advances to the step S225, the central frequency f is reset at a value 1 MHz larger (f increment). And the process advances to the step S230, and the question of whether the value of the central frequency set in the step S225 is within the range of VHF band or not is judged. When the value of the central frequency is within the range of the VHF band, it is considered that the conditions have been met and the process returned to the step S205, and the processing starting with the step S205 is repeated. On the other hand, if the value of the central frequency is not in the VHF band, it is considered that the conditions have not been met, and the process advances to the step S235.

On the other hand, if the conditions have not been met in the step S220 and the process advances to the step S250, the central frequency f is rest at a value larger by 7 MHz (f increment). And the process advances to the step S255, and the question of whether the value of the central frequency set in the step S250 is within the range of VHF band or not is judged. If it is found that the value of the central frequency is within the range of the VHF band, it is considered that the conditions have been met and the process advances to the step S260. On the other hand, if the value of the central frequency is not in the VHF band, it is considered that the conditions have not been met, and the process advances to the step S235.

As the process advances to the step S260, broadcast signals are searched within the predetermined range from the central frequency set in the step S250. And the process advances to the step S265, where the question whether broadcast signals were detected or not is judged in the step S260. If the broadcast signals were detected, it is considered that the conditions have been met, and the process advances to the step S270, where the frequency of the detected broadcast signals is stored in the predetermined area of the semiconductor memory 35 and the process returns to the step S250 and the process beginning with the step S250 is repeated. On the other hand, if the broadcast signals have not been detected, it is considered that the conditions have not be met and the process returns to the step S250, and the process beginning with the step S250 is repeated.

On the other hand, if the value of the central frequency set in the step S230 and the step S255 is not in the VHF band and the conditions are not met, the process advances to the step S235, where the broadcast signals in the VHF High band and the UHF band are searched by the standard step (VHF: 7 MHz step, and UHF: 8 MHz step) to end the processing.

As described above, the microcomputer 30 assigned to the task of executing the processing of the steps S200-S205, S220-S230, and S250-S260 shown in FIG. 7 constitutes the broadcast signals search unit 60 in the first variation. And the microcomputer 30 assigned to the task of executing the processing of the steps S210-S215 and the steps S265-S270 shown in FIG. 7 constitutes the channel setting unit 61 in the first variation.

(2) THE SECOND VARIATION OF THE PROCESSING OF THE MICROCOMPUTER FOR PRESETTING CHANNELS

In the embodiment described above, if it is determined that the detected frequency belongs to the place of destinations where any one of the channel plans is adopted after comparing the frequency detected at the stage where a carrier frequency of broadcast signals has been detected and the channel plan, the channel presetting operation may be terminated according to the information showing the channel plans stored in the semiconductor memory 35 without executing the subsequent broadcast signal searches.

The adoption of such a configuration can further save the time required for searching broadcast signals and is convenient. In such a case, it is necessary to store in the same way as the first variation described above the information containing the channel plan of each place of destination in storage mediums such as the semiconductor memory 35.

In this case, among the processes of the first variation, the steps S250, S255, S260, S265 and S270 are unnecessary. Instead, after completing the step S220, the microcomputer 30 acquires the information containing the channel plan of the identified place of destination from the semiconductor memory 35, and sets the channels and the central frequencies based on the acquired information in the predetermined area of the semiconductor memory 35.

Therefore, in the present second variation, the microcomputer 30 assigned to the task of executing the processing of the steps S200-S205 and S220-S230 shown in FIG. 7 constitutes the broadcast signal search unit 60. And in the second variation, the microcomputer 30 assigned to the task of executing the processing of the steps S210-S215 shown in FIG. 7, of acquiring the information containing the channel plan of the identified places of destination from the semiconductor memory 35 and setting the channels and the central frequencies based on the acquired information in the predetermined area of the semiconductor memory 35 constitutes the above-mentioned channel setting unit 61.

(6) CONCLUSION

In short, when the channel presetting operation has started, the microcomputer 30 sets the central frequency with a step of 1 MHz within the range from the minimum frequency in the VHF band channel plan to the maximum frequency of the VHF band adopted in the places of destination for scheduled shipment of the TV broadcast receiver, tries to detect broadcast signals by changing the frequency within a range of 1.5 MHz to the high-frequency side and 0.5 MHz to the low-frequency side centered around the central frequency by controlling the variable frequency divider 17, and upon detection of broadcast signals, stores the frequency of the detected broadcast signals in the predetermined area of the semiconductor memory 35.

As described above, the TV broadcast receiver according to the present embodiment for receiving TV broadcast signals, displaying the corresponding image signals on the screen and for outputting the corresponding voice signals from a speaker is configured to include a PLL tuner, a broadcast signal search unit for making the tuner search broadcast signals in a narrower step than the standard step and a channel setting unit for setting channels based on the results of the broadcast signal search described above.

The broadcast signal search unit makes the tuner search broadcast signals in a step narrower than the standard step, and the channel setting unit sets channels based on the result of the broadcast signal search. The standard step means 7 MHz step in the VHF band and 8 MHz step in the UHF band according to the PAL/SECAM system, and 8 MHz step in both VHF/UHF band according to the NTSC method. This step also means a channel plan, and the broadcast signals exist in the standard step in regions where the standard channel plan is adopted.

And the broadcast signal search unit searches the presence of broadcast signals in the predetermined range to the high-frequency side and the low-frequency side of the central frequency in each step. And a step narrower than the standard step is preferably a step smaller than the predetermined range searched by the broadcast signal search unit. For example, if fa MHz on the high-frequency side and fb MHz on the low-frequency side are the predetermined range, it is preferable that the above-mentioned step would be within fa+fb MHz.

By the adoption of the configuration described above, it will be possible to prevent the omission of any broadcast signals from the search even in a place of destination where the standard channel plan is not adopted, and to supply products of the uniform specification to places of destination with different channel plans resulting in a possible reduction of costs and improvement in work productivity. It is also possible to search irregular broadcast signals not listed in any channel plan and to set channels of broadcast signals in a region where a plurality of broadcasting stations based on different channel plans are operating by a single broadcast signal search.

And as preferable examples of the step described above, in another mode of the present embodiment, the broadcast signal search unit makes the tuner search broadcast signals in a range of 0.5 MHz to the low frequency side and 1.5 MHz to the high frequency side from the central frequency.

The predetermined range of 0.5 MHz to the low frequency side and 1.5 MHz to the high frequency side from the central frequency is a value adopted as the standard value in ordinary tuners, and the above-mentioned step can be adopted using this value as the standard value. In other words, since it has been made clear that the presence of broadcast signals is searched in the range of 2 MHz centered around the central frequency, it is preferable that the step in which the broadcast signal search unit searches would be equal to or narrower than 2 MHz. Therefore, it will be possible to provide TV broadcast receivers wherein the standard tuner adopting a step without the risk of search being omitted.

An optional aspect of the present invention provides the broadcast signal search unit is configured to make the PLL-type tuner search broadcast signals in the above-mentioned step only in the VHF band.

In other words, even in regions where channel plans other than the standard one is adopted, the same channel plan as the standard channel plan is often adopted in the UHF band, it is not always necessary to search broadcast signals in a narrower step than the standard step in the UHF band.

Since the frequency band in which the standard step is not adopted is almost exclusively the VHF band, it has been made clear that no search will be conducted in a step narrower than the standard step in frequency bands other than the VHF band, in other words the UHF band. By the adoption of this policy, it will be possible to prevent any omission of search of broadcast signals by making the step for the search of broadcast signals narrower than the standard step only in the VHF bank, to curtail the time required for searching broadcast signals by expanding the step width in the UHF band for which the standard channel plan is adopted and to reduce the processing required for searching broadcast signals.

And according to yet another mode of the present embodiment, the TV broadcast receiver includes a storage medium in which the channel plans for respective places of destination are stored and the channel setting unit identifies the place of destination by comparing the result of the broadcast signal search and the channel plan.

In other words, the channel setting unit identifies the place of destination where broadcast signals are searched by comparing the combination of frequencies in which the presence of broadcast signals is determined and the channel plan for each place of destination.

In yet other words, in a region where a channel plan other than the standard one is adopted, a characteristic channel plan is often adopted due to their connection with their neighboring countries. In such a case, it is possible to identify which channel plan is the one adopted there from the result of broadcast signal search even without searching the whole VHF band. And it is also possible to use the channel plan for the identified place of destination as it is for setting the channel. Therefore, it is possible to curtail the time required for searching broadcast signals and to reduce the processing required for the searching operation of broadcast signals.

And in yet another mode of the present embodiment, when the place of destination is identified, the broadcast signal search unit is configured to have broadcast signals searched based on the channel plan for the place of destination.

In other words, when the place of destination is identified, the broadcast signal search unit carries out the subsequent broadcast signal searches based on the channel plan of the identified place of destination. Therefore, the number of searches is reduced and the channel of the frequency carrying no broadcast signal although existing in the channel plan is not set and as a result the broadcast signal search unit will be more convenient for the users.

Taking into consideration the configuration described above, as the more specific mode of the present embodiment, the TV broadcast receiver including a tuner having a frequency synthesizer-type channel select mechanism based on the PLL circuitry for receiving TV broadcast signals according to the SECAM method and the PAL method, for displaying the corresponding image signals on the screen and for outputting the corresponding voice signals from a speaker, wherein the tuner includes:

a high-frequency amplification circuit for amplifying and outputting the inputted RF signals on which broadcast signals are superimposed;

a variable frequency divider for dividing the inputted locally oscillated signals and outputting the divided signals;

a reference oscillator for outputting the signals oscillated by a crystal oscillator and the like which are turned into the reference signals after passing through a fixed frequency divider;

a detection circuit for detecting and outputting the positive and/or negative voltage corresponding to the phase difference between the two signals, i.e. the frequency divider signal for one and the reference signal for the other;

an integrating circuit for outputting the DC component out of the inputted detection output;

a voltage controlled oscillator for outputting the locally oscillated signals out of the inputted DC component; and a mixing circuit for outputting the differential signal between the locally oscillated signal and the high-frequency amplified RF signal as the intermediate frequency signal. At the same time, the tuner includes:

a microcomputer for tuning the tuner to a plurality of channel frequencies within the predetermined band by controlling the locally oscillated frequency by changing the frequency dividing ratio by controlling the variable frequency divider, and a semiconductor memory for storing the information containing the channel number and the central frequency of the preset channel as required in the predetermined area. And when the channel presetting operation has started, the microcomputer sets the central frequencies by a 1 MHz step within the range from the minimum frequency in the VHF band channel plan to the maximum frequency in the VHF band adopted for the place of destination for scheduled shipment of the TV broadcast receiver, attempts to detect broadcast signals by changing the frequency within a range of 1.5 MHz to the high frequency side and 0.5 MHz to the low frequency side centered around the central frequency by controlling the variable frequency divider, stores the frequency of the detected broadcast signals in the predetermined area of the semiconductor memory when the broadcast signals have been detected, sets the central frequency by a step of 8 MHz in the UHF band, attempts to detect broadcast signals by changing the frequency within a range of 1.5 MHz to the high frequency side and 0.5 MHz to the low frequency side centered around the central frequency by controlling the variable frequency divider, and upon the detection of broadcast signals stored the frequency of the detected broadcast signals in a predetermined area of the semiconductor memory.

Incidentally, it is needless to say that the present invention is not limited to the embodiment described above. Although it is obvious to persons skilled in the art, a) the application of the mutually interchangeable members, configurations and the like disclosed in the above embodiment by changing their combination as required, b) the application of the members and configurations not disclosed in the above embodiment but being publicly known art and mutually interchangeable with the members and configuration disclosed in the above embodiment by interchanging them or by changing their combination as required, and c) the application by replacing by and changing as required the combination of the members and configurations not disclosed in the above embodiment but which any person skilled in the art may be able to envisage as substitute for the members and the configuration disclosed by the above embodiment based on the publicly known art and the like, are disclosed as an embodiment of the present invention.

What is claimed is:

1. A TV broadcast receiver having a tuner with a frequency synthesizer-type channel select mechanism including a phase locked loop (PLL) circuitry for receiving TV broadcast signals by a séquentiel couleur a mémoire (SECAM) method and a phase alternation by line (PAL) method, and having a integrated circuits (IC) for displaying pictures corresponding to the TV broadcast signals on a screen and for outputting sounds corresponding to the TV broadcast signals on a speaker, comprising:

with the tuner comprises:

a high-frequency amplification circuit for amplifying and outputting inputted RF signals on which broadcast signals are superimposed;

a variable frequency divider for dividing inputted locally oscillated signals and outputting a divided signal;

a reference oscillator for outputting a signal oscillated by a crystal oscillator which are turned into a reference signal after passing through a fixed frequency divider;

a detection circuit for detecting and outputting a positive or a negative voltage corresponding to a phase difference between the divided signal and the reference signal;

an integrating circuit for outputting a DC component out of an inputted detection output;

a voltage controlled oscillator for outputting a locally oscillated signals out of an inputted DC component; and a mixing circuit for outputting a differential signal between the locally oscillated signal and a high-frequency amplified RF signal as an intermediate frequency signal out of the input of the RF signal outputted by the high-frequency amplification circuit and the locally oscillated signals;

the tuner further comprises:

a microcomputer for tuning the tuner to a plurality of channel frequencies within a predetermined band by controlling the locally oscillated frequency by changing a frequency dividing ratio by controlling the variable frequency divider; and a semiconductor memory for storing information containing a channel number and a central frequency of a preset channel, wherein when a channel presetting operation has started, the microcomputer sets the central frequencies by a 1 MHz step within a range from a minimum frequency in a VHF band channel plan to a maximum frequency in the VHF band adopted for a place of destination for scheduled shipment of the TV broadcast receivers, attempts to detect broadcast signals by changing the channel frequency within a range of 1.5 MHz to a high frequency side and 0.5 MHz to a low frequency side centered around the central frequency by controlling the variable frequency divider, stores the frequency of the detected broadcast signals in a predetermined area of the semiconductor memory when the broadcast signals have been detected, sets the central frequency by a step of 8 MHz in a UHF band, attempts to detect broadcast signals by changing the channel frequency within a range of 1.5 MHz to the high frequency side and 0.5 MHz to the low frequency side centered around the central frequency by controlling the variable frequency divider, and upon the detection of broadcast signals stored, stores the frequency of the detected broadcast signals in a predetermined area of the semiconductor memory.

2. A TV broadcast receiver for displaying the corresponding picture on the screen and for outputting the corresponding sound on a speaker comprising:

a PLL-type tuner;

a storage medium in which channel plan data for each place of destination is stored;

a broadcast signal search unit for setting central frequencies of the broadcast signal search to the phase locked loop (PLL)-type tuner by a step that is narrower than a standard step in a VHF band, and for setting central frequencies of the broadcast signal search to the PLL-type tuner by a step of a standard step in a UHF band; and a channel setting unit for setting channels based on the broadcast signal search;

wherein when the channel setting unit identifies the place of destination by comparing the result of the broadcast signal search and the channel plan data, the broadcast signal search unit searches broadcast signals based on the channel plan data for each the place of destination after the place of destination has been identified.

3. The TV broadcast receiver according to claim 2 wherein the broadcast signal search unit makes the PLL-type tuner search broadcast signals within a range of 0.5 MHz to the low frequency side and 1.5 MHz to the high frequency side of a central frequency.

* * * * *